United States Patent
Ishikawa (10) Patent No.: US 9,935,324 B2
(45) Date of Patent: Apr. 3, 2018

(54) VOLTAGE DETECTION DEVICE FOR FUEL CELL

(75) Inventor: Satoshi Ishikawa, Mikinohara (JP)

(73) Assignee: YAZAKI CORPORATION, Tokyo (JP)

(*) Notice: Subject to any disclaimer, the term of this patent is extended or adjusted under 35 U.S.C. 154(b) by 352 days.

(21) Appl. No.: 13/643,586

(22) PCT Filed: Apr. 20, 2011

(86) PCT No.: PCT/JP2011/059757
§ 371 (c)(1),
(2), (4) Date: Oct. 26, 2012

(87) PCT Pub. No.: WO2011/136111
PCT Pub. Date: Nov. 3, 2011

(65) Prior Publication Data
US 2013/0043861 A1    Feb. 21, 2013

(30) Foreign Application Priority Data

Apr. 28, 2010  (JP) ................. 2010-103799

(51) Int. Cl.
| | |
|---|---|
| G01W 1/16 | (2006.01) |
| H01M 8/04537 | (2016.01) |
| B60L 11/18 | (2006.01) |
| H01M 8/04955 | (2016.01) |
| G01R 31/36 | (2006.01) |

(52) U.S. Cl.
CPC ..... *H01M 8/04552* (2013.01); *B60L 11/1881* (2013.01); *H01M 8/04559* (2013.01);
(Continued)

(58) Field of Classification Search
CPC ............... G01R 19/00; G01R 31/3658; H01M 8/04552; H01M 8/04559; H01M 8/04955;
(Continued)

(56) References Cited

U.S. PATENT DOCUMENTS

| | | | |
|---|---|---|---|
| 6,313,637 | B1 | 11/2001 | Iino et al. |
| 7,126,342 | B2* | 10/2006 | Iwabuchi et al. ............. 324/426 |

(Continued)

FOREIGN PATENT DOCUMENTS

| | | |
|---|---|---|
| CN | 101453133 A | 6/2009 |
| FR | 2 934 419 A1 | 1/2010 |

(Continued)

OTHER PUBLICATIONS

International Search Report (PCT/ISA/210), issued by the International Searching Authority in corresponding International Application No. PCT/JP2011/059757 dated May 24, 2011.

(Continued)

*Primary Examiner* — Melissa Koval
*Assistant Examiner* — Courtney McDonnough
(74) *Attorney, Agent, or Firm* — Sughrue Mion, PLLC (57) ABSTRACT

A voltage detection device includes voltage detection sections that measure cell voltages in the blocks, a control section, and (N−1) or less converters that raise the voltage, which is supplied from a DC power source, to a voltage of a driving power source for the voltage detection section. In a case where a voltage detected by at least one voltage detection section among the voltage detection sections which operate by the power supplied from the respective converters, exceeds a predetermined threshold value, the control section controls at least one voltage detection section among the voltage detection sections to operate using the cell voltage of each of the blocks as a driving power source and acquires the cell voltage in each of the blocks.

2 Claims, 6 Drawing Sheets

(52) U.S. Cl.
CPC ..... *H01M 8/04955* (2013.01); *G01R 31/3658* (2013.01); *H01M 2250/20* (2013.01); *Y02T 90/32* (2013.01); *Y02T 90/34* (2013.01)

(58) Field of Classification Search
CPC ............ H01M 2250/20; B60L 11/1881; Y02T 90/32; Y02T 90/34
USPC .......................................................... 324/72
See application file for complete search history.

(56) References Cited

U.S. PATENT DOCUMENTS

| | | |
|---|---|---|
| 2005/0057219 A1 | 3/2005 | Kaminski et al. |
| 2007/0202371 A1 | 8/2007 | Takeda et al. |
| 2009/0212761 A1 | 8/2009 | Ohta et al. |
| 2010/0021775 A1 | 1/2010 | Lee et al. |
| 2010/0038962 A1* | 2/2010 | Komatsu ..................... 307/10.1 |
| 2010/0188093 A1* | 7/2010 | Minoda et al. ............... 324/427 |
| 2011/0151347 A1 | 6/2011 | Araki |

FOREIGN PATENT DOCUMENTS

| | | |
|---|---|---|
| JP | 11-160367 A | 6/1999 |
| JP | 2007-232417 A | 9/2007 |
| JP | 2010-49894 A | 3/2010 |
| JP | 2010-170893 A | 8/2010 |

OTHER PUBLICATIONS

Written Opinion (PCT/ISA/237) of the International Searching Authority, issued in corresponding International Application No. PCT/JP2011/059757 dated May 24, 2011.
Extended European Search Report, dated Apr. 25, 2014, issued by the European Patent Office in counterpart European Patent Application No. 11774894.7.
Office Action dated May 6, 2014 issued by the State Intellectual Property Office of P.R. China in corresponding Chinese Application No. 201180011488.2.
Communication dated May 17, 2016, issued by the European Patent Office in counterpart European Application No. 11774894.7.

* cited by examiner

VOLTAGE DETECTION DEVICE FOR FUEL CELL

TECHNICAL FIELD

The present invention relates to a voltage detection device that detects a cell voltage of a fuel cell, and more particularly, to a technology that may measure the cell voltage even when fuel is not supplied to the cell.

BACKGROUND ART

In recent years, fuel cell vehicles, which generate power using hydrogen and oxygen as fuel and travel by driving a motor using this power, have been widely developed. The fuel cell is excellent in terms of an environment aspect, and may realize high energy efficiency such that the fuel cell is very promising as an energy source for vehicles in the future.

Commonly, the fuel cell that is mounted on the vehicle includes a plurality of cells and the respective cells are connected in series to generate a high voltage, for example, 200 V. This voltage is supplied to a motor to drive the vehicle.

This fuel cell vehicle is provided with a voltage detection device that measures the voltage that is generated in each cell. Whether or not an appropriate voltage is generated is monitored by classifying a plurality of cells into blocks, and by measuring a cell voltage for each block (for example, refer to Patent Literature 1). For example, in a fuel cell including 55 cells in total, 11 cells are set to one block, and in total, five blocks are configured. The cell voltage for each block is measured by a voltage detecting IC that is provided for each block, and it is monitored whether or not the cell voltage is maintained at a normal voltage.

At this time, as is the case with the above-described example, in a case where 55 cells in total are classified into five blocks, each block having 11 cells, a voltage that is output from one block is substantially 40 V, and the voltage detecting IC, which is provided in each block, operates using a voltage of substantially 40 V output from each cell as a power source voltage to measure a voltage for each block. That is, the voltage detecting IC operates using a cell voltage that is an object to be measured as a power source voltage.

Here, in a case where fuel is not supplied to a cell provided in the fuel cell, since a voltage is not generated in the cell of each block, the voltage for the power source is not supplied to the voltage detecting IC, and thus the voltage detecting IC does not operate.

CITATION LIST

Patent Literature

Patent Literature 1 JP-A-2010-49894

SUMMARY OF INVENTION

Technical Problem

As described above, in the voltage detection device for a fuel cell in the related art, in a case where fuel is not supplied to a cell, the voltage detecting IC is not operated, and thus the measurement of a cell voltage may not be performed.

The invention has been made to solve the problem in the related art, and an object of the invention is to provide a voltage detection device for a fuel cell that is capable of measuring an output voltage of each cell and of informing an operator of this output voltage even when fuel is not supplied to each cell.

Solution to Problem

To accomplish the object, according to a first aspect of the invention, there is provided a voltage detection device for detecting an output voltage of a fuel cell in which a plurality of cells are connected in series to output a desired voltage, in which the plurality of cells are classified into N (N≥2) blocks, each block including at least one cell. The voltage detection device includes: voltage detection sections that are provided for the blocks respectively and measure cell voltages in the blocks; a control section that is connected to the voltage detection sections through a communication line, outputs a voltage detection instruction to the respective voltage detection sections, and receives a voltage detection signal transmitted from each of the voltage detection section; and (N−1) or less converters that raise the voltage, which is supplied from a DC power source, to a voltage of a driving power source for the voltage detection section. Each of the converters is connected to arbitrary (N−1) blocks among the N blocks. The control section supplies power from each of the converters to the voltage detection section of the block corresponding to each of the converters to operate the voltage detection section when the output of the fuel cell is initiated, and in a case where a voltage that is detected by at least one voltage detection section among the respective voltage detection sections that operate by the power supplied from the respective converters, exceeds a predetermined threshold value, the control section controls at least one voltage detection section among the voltage detection sections provided to the respective blocks to operate using the cell voltage of each of the blocks as a driving power source and acquires the cell voltage in each of the blocks.

According to a second aspect of the invention, in the voltage detection device, the number of converters may be two, the plurality of cells may be connected in series to each other on the basis of a ground level, and the converters may be connected to a lower end voltage block including cells that are connected to the ground level among the plurality of cells and an upper end voltage block that is connected to a maximum voltage level, respectively, and in a case where the detection voltage of the voltage detection section exceeds the predetermined threshold value at both of the lower end voltage block and the upper end voltage block, the control section may control all of the voltage detection sections provided to the respective blocks to operate by using the cell voltage of each of the blocks as the driving power source.

According to a third aspect of the invention, in the voltage detection device, the number of converters may be one, and in a case where the voltage that is detected by the voltage detection section to which the converter is connected exceeds the predetermined threshold value, the control section may control all of the voltage detection sections to operate by using the cell voltage of each of the blocks as the driving power source.

According to a fourth aspect of the invention, in the voltage detection device, the number of converters may be one, and in a case where the voltage that is detected by the voltage detection section to which the converter is connected exceeds the predetermined threshold value, the control section may control all of the voltage detection sections except for the voltage detection section to which the converter is connected to operate by using the cell voltage of each of the blocks as the driving power source.

According to a fifth aspect of the invention, in the voltage detection device, the fuel cell may be used as a driving power source of a motor that is mounted in a vehicle, and the DC power source may be a battery that is mounted in the vehicle.

Advantageous Effects of Invention

According to the first aspect of the invention, since the converters are connected with respect to the (N−1) voltage detection sections among the voltage detection sections (voltage detecting ICs) of the N blocks to supply power for the power source, even when the cell voltage is reduced for reasons such as fuel not being supplied to the cells of the fuel cell, the cell voltage may be reliably measured in the (N−1) voltage detection sections. Furthermore, since voltage detection is performed by all of the N voltage detection sections in a case where the cell voltage exceeds a predetermined threshold value in at least one among the (N−1) voltage detection sections to which the converter is connected, the cell voltages of all of the blocks may be reliably measured.

In addition, in the voltage detection section to which the converter is not connected, the detection of cell voltage is initiated in a case where it is determined that fuel is supplied to the cell, such that the measurement is not executed in a state in which the power source voltage is low, and problems such as malfunction and false detection due to a low power source voltage may be prevented from occurring. Furthermore, a circuit configuration may be simple compared to a case in which converters are connected to all of the N voltage detection sections, respectively.

According to the second aspect of the invention, the converters are connected to the lower end voltage block and the upper end voltage block, and the cell voltages of the lower end voltage block and the upper end voltage block are measured as power outputs from the converters, and in a case where both of the cell voltages of the respective blocks exceed the threshold voltage, voltage measurement by the voltage detection sections is executed with respect to all of the blocks including both of the lower end voltage block and the upper end voltage block. In this case, since the cell voltages of both of the lower end voltage block that is closest to the ground level and the upper end voltage block that is closest to the maximum voltage, exceed the threshold voltage, it may be determined that with respect to other blocks, the cell voltages exceed the threshold value, and thus the voltage detection with high accuracy may be realized.

According to the third aspect of the invention, the converter is connected to only one voltage detection section among the plurality of voltage detection sections, in order to detect the cell voltage and thus the number of converters may be the minimum, and the cell voltage of each of the block may be detected with high accuracy.

According to the fourth aspect of the invention, the converter is connected to only one voltage detection section among the plurality of voltage detection sections, and the cell voltage is detected, the number of converters may be the minimum. In addition, the voltage detection section to which the converter is connected continuously operates using power that is output from the converter, such that even when there is a problem in that the cell voltage decreases after the initiation of the voltage detection with the cell voltage set as the power source, the voltage detection with high accuracy may be realized.

According to a fifth aspect of the invention, since the voltage detection device is used in the detection of the cell voltage of the fuel cell that is mounted in the vehicle, a charge state of the fuel cell that is mounted in the vehicle may be detected with high accuracy.

DESCRIPTION OF EMBODIMENTS

Figure 1:
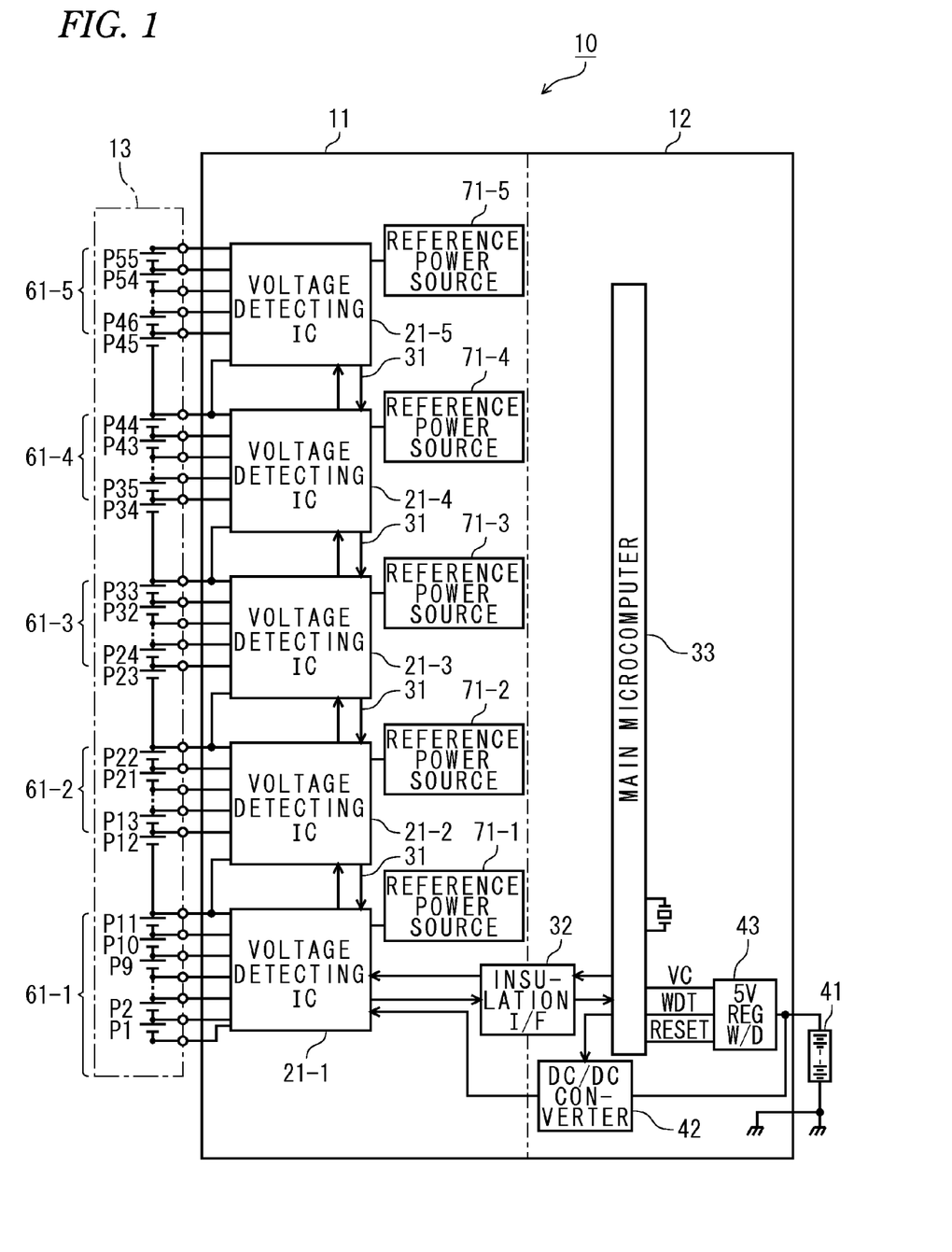
FIG. 1 is a block diagram illustrating a configuration of a voltage detection device for a fuel cell according to a first embodiment of the invention.

Hereinafter, embodiments of the invention will be described with reference to the attached drawings. FIG. 1 shows a block diagram illustrating a fuel battery 13 including a voltage detection device 10 for a fuel cell according to a first embodiment and a plurality of cells P1 to P55. For example, the fuel battery 13 according to this embodiment is mounted in a vehicle and is used for supplying driving power of a vehicle driving motor.

As shown in FIG. 1, the voltage detection device 10 according to this embodiment is divided into a high-voltage side device 11 and a low-voltage side device 12 with an insulation interface 32 interposed therebetween.

The high-voltage side device 11 is provided with five voltage detecting ICs (voltage detection sections), that is, a first voltage detecting IC (21-1) to a fifth voltage detecting IC (21-5). The first voltage detecting IC (21-1) measures an output voltage of 11 cells P1 to P11 that are classified as a first block 61-1 (a lower end block). In addition, the second voltage detecting IC (21-2) measures an output voltage of 11 cells P12 to P22 that are classified as a second block 61-2. Similarly, the third voltage detecting IC (21-3) measures an output voltage of 11 cells P23 to P33 that are classified as a third block 61-3. The fourth voltage detecting IC (21-4) measures an output voltage of 11 cells P34 to P44 that are classified as a fourth block 61-4. The fifth voltage detecting IC (21-5) measures an output voltage of 11 cells P45 to P55 that are classified as a fifth block 61-5 (upper end block).

Figure 2:
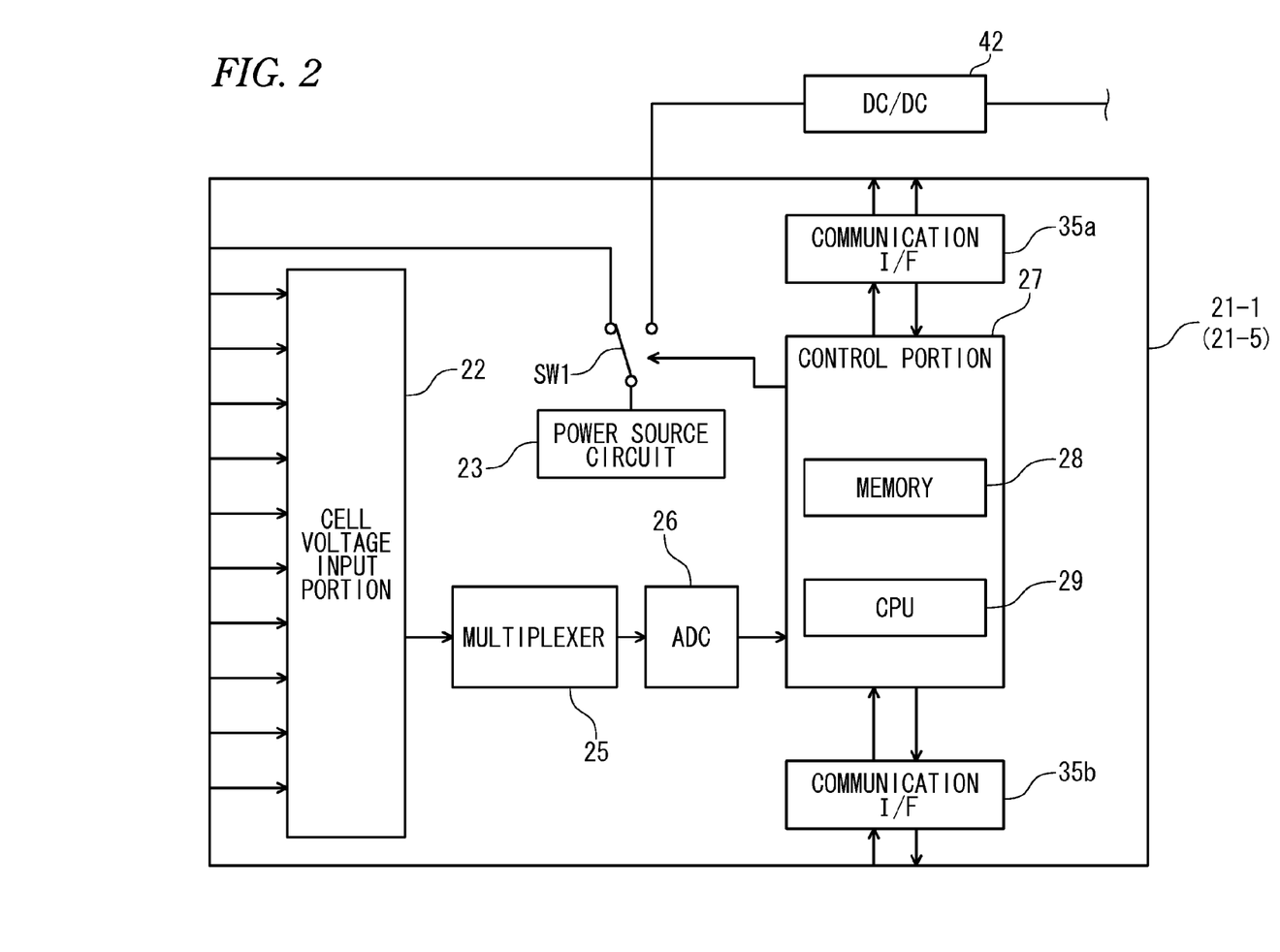
FIG. 2 is a block diagram illustrating a configuration of a first voltage detecting IC (first and second voltage detecting ICs in a second embodiment) of the voltage detection device of the fuel cell according to first and second embodiments of the invention.
Figure 3:
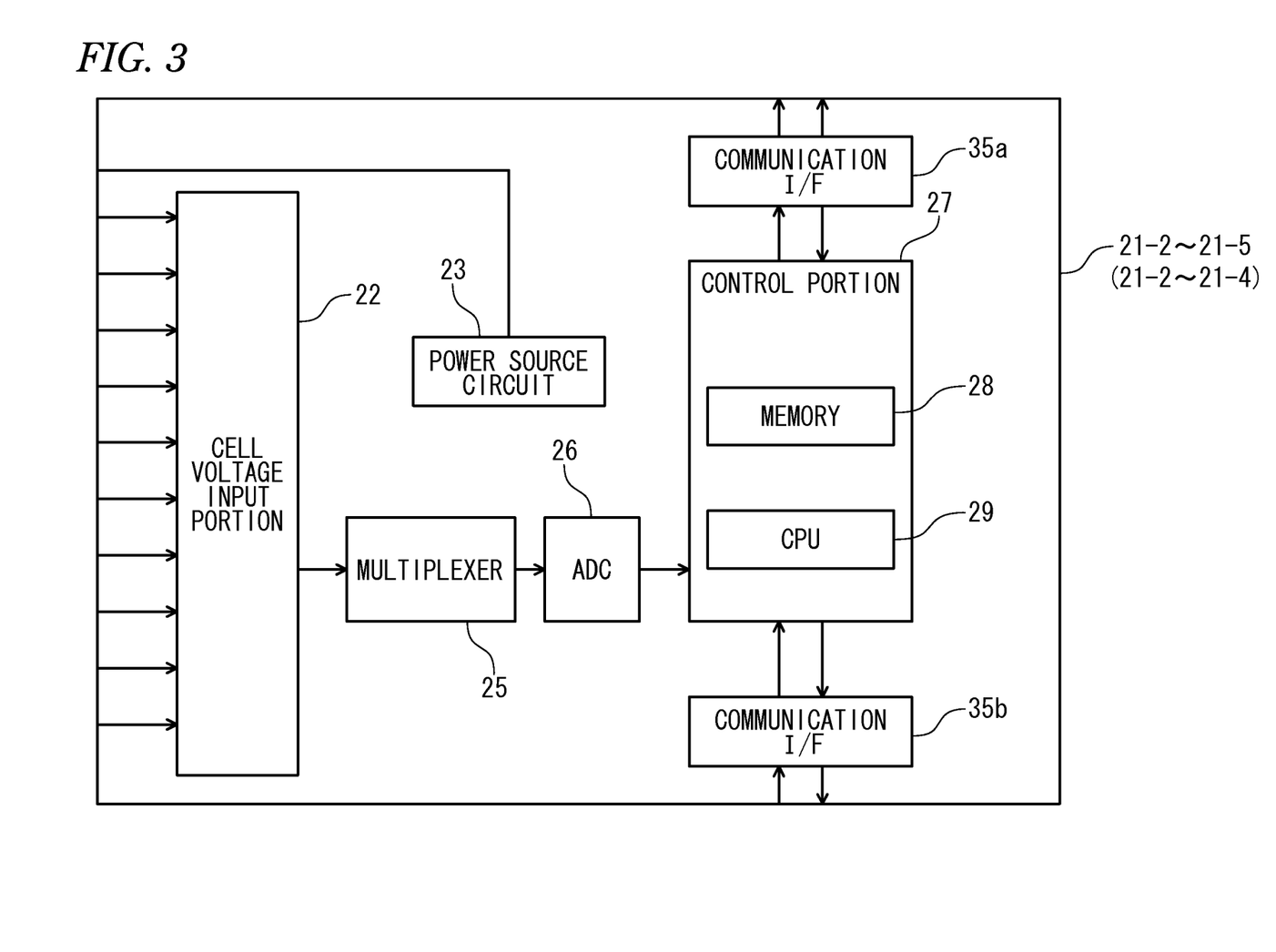
FIG. 3 is a block diagram illustrating a configuration of second to fifth voltage detecting ICs (second to fourth voltage detecting ICs in the second embodiment) of the voltage detection device of the fuel cell according to the first and second embodiments of the invention.

In addition, each of the voltage detecting ICs (21-1) to (21-5) is provided with an A/D converter 26 (refer to FIGS. 2 and 3; denoted as "ADC"). The respective voltage detecting ICs (21-1) to (21-5) convert a voltage signal, which is measured for each of the cells provided to the respective blocks (the first block 61-1 to the fifth block 61-5), to a digital voltage signal by using a reference voltage that is output from each of reference power sources 71-1 to 71-5 (refer to FIG. 1) for A/D conversion.

Furthermore, the second to fifth voltage detecting ICs (21-2) to (21-5) are connected to the first voltage detecting IC (21-1) via a communication line 31. The first voltage detecting IC (21-1) is connected to a main microcomputer (control section) 33 that is provided at the side of the low-voltage side device 12 via an insulation interface 32. That is, the main microcomputer 33 and the respective voltage detecting ICs (21-1) to (21-5) are connected to each other in a daisy chain communication manner via the insulation interface 32.

In addition, the low-voltage side device 12 is provided with a regulator 43 that outputs a DC voltage of 5 V. The regulator 43 generates a stable DC voltage of 5 V from a voltage (for example, 12 V) that is output from the battery (DC power source) 41 that is mounted in the vehicle and supplies this generated DC voltage to the main microcomputer 33.

Furthermore, the battery 41 is connected to a DC/DC converter (converter) 42. The DC/DC converter 42 raises a voltage (for example, 12 V) that is output from the battery 41 and outputs the resultant voltage to the first voltage detecting IC (21-1).

FIG. 2 shows a block diagram illustrating an internal configuration of the first voltage detecting IC (21-1). Hereinafter, a detailed configuration of the first voltage detecting IC (21-1) will be described with reference FIG. 2.

As shown in FIG. 2, the first voltage detecting IC (21-1) is provided with a power source circuit 23 to which either power that is output from each of the cells P1 to P11 or power that is output from the DC/DC converter 42 is input and which generates a predetermined voltage, a cell voltage input portion 22 that is connected to the respective cells P1 to P11 provided to the first block 61-1 and detects output voltages thereof, a multiplexer 25 that converts a voltage signal, that is output from the cell voltage input portion 22, of each of the cells to a time-series signal of one system, an A/D converter 26 that converts a voltage signal, that is output from the multiplexer 25, of each unit cell to a digital signal.

A selection switch SW1 is connected to the power source circuit 23. One side connection terminal of the selection switch SW1 is connected to the respective cells P1 to P11 side and the other side connection terminal is connected to the DC/DC converter 42 side. In addition, when the selection switch SW1 is switched, either power that is output from each of the cells P1 to P11 or power that is output from the DC/DC converter 42 is selected and is supplied to the power source circuit 23.

The A/D converter 26 converts an analog signal to a digital signal using a reference voltage that is output from the reference power source 71-1 (refer to FIG. 1). In addition, the first voltage detecting IC (21-1) is provided with a control portion 27 and two communication interfaces 35a and 35b.

The control portion 27 is provided with a CPU 29 and a data storage memory 28 and controls the first voltage detecting IC (21-1) in an overall manner. Particularly, in a case where a voltage measurement request signal of the cell voltage is transmitted from the main microcomputer 33 shown in FIG. 1, the control portion 27 transmits total output voltage signals, which are measured by the cell voltage input portion 22, of the respective cells P1 to P11 to the main microcomputer 33 via the communication interfaces 35a and 35b. In addition, in a case where a switching instruction signal of the selection switch SW1 is transmitted from the main microcomputer 33, the control portion 27 performs control of switching the selection switch SW1. In addition, the memory 28 stores the total cell voltage of the respective cells P1 to P11.

The main microcomputer 33 determines whether or not the voltage signal (total cell voltage of the respective cells P1 to P11) that is transmitted from the first voltage detecting IC (21-1) is greater than a threshold voltage that is set in advance, and in a case where it is determined that the total cell voltage is greater than the threshold voltage, the main microcomputer 33 transmits the switching instruction signal of the selection switch SW1 to the first voltage detecting IC (21-1). Here, the threshold voltage is a voltage with which the total cell voltage of the respective cells P1 to P11 is capable of allowing the power source circuit 23 to output a predetermined voltage, and the threshold voltage is set in the main microcomputer 33 in advance. In addition, as described later, in a case where the total cell voltage of the respective cells P1 to P11 has not reached the threshold voltage, the selection switch SW1 is connected to the DC/DC converter 42 side, and in a case where the total cell voltage has reached the threshold voltage, the selection switch SW1 is connected to the cell side.

FIG. 3 shows a block diagram illustrating an internal configuration of the second voltage detecting IC (21-2). As shown in FIG. 3, the second voltage detecting IC (21-2) is different from the first voltage detecting IC (21-1) shown in FIG. 2 in that the second voltage detecting IC (21-2) is not provided with the selection switch SW1. That is, the power that is output from each of the cells P12 to P22 is supplied to the power source circuit 23 and the power source circuit 23 generates a power source voltage to operate the second voltage detecting IC (21-2). Other configurations are the same as those in FIG. 2, such that the same reference numerals are given thereto and the description thereof will be omitted.

In addition, the third to fifth voltage detecting ICs (21-3) to (21-5) have the same configuration as the second voltage detecting IC (21-2) shown in FIG. 3, such that detailed description thereof will be omitted.

Figure 4:
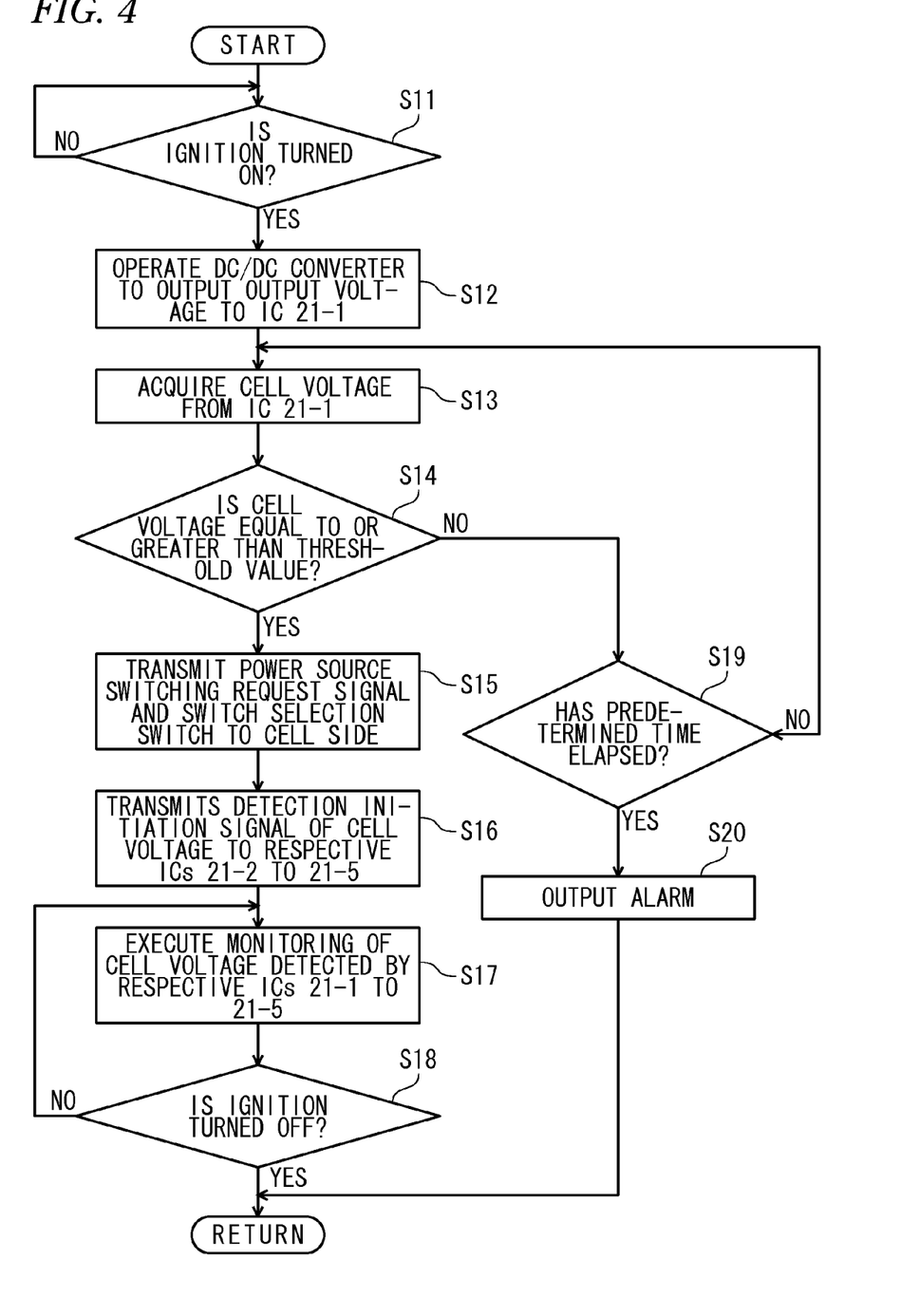
FIG. 4 is a flowchart illustrating a processing operation of the voltage detection device of the fuel cell according to the first embodiment of the invention.

Next, an operation of the voltage detection device 10 according to the first embodiment will be described. FIG. 4 shows a flowchart illustrating a processing sequence of the main microcomputer 33.

First, the main microcomputer 33 determines whether or not an ignition of the vehicle is turned on from a host system (step S11). In addition, when it is determined that the ignition is turned on (YES in step S11), the main microcomputer 33 operates the DC/DC converter 42 to output an output voltage thereof to the first voltage detecting IC (21-1) (step S12). As a result, the output voltage (for example, 12 V) of the battery 41 is raised to a high voltage of substantially 40 V, and is supplied to the first voltage detecting IC (21-1).

In addition, the main microcomputer 33 transmits a selection instruction signal of the output voltage of the DC/DC converter 42 to the first voltage detecting IC (21-1). As a result, the selection switch SW1 shown in FIG. 2 is connected to the DC/DC converter 42 side, and the power source circuit 23 acquires power output from the DC/DC converter 42, and generates a power source voltage for operating the first voltage detecting IC (21-1).

Then, the first voltage detecting IC (21-1) initiates detection of the output voltages of the respective cells P1 to P11 (step S13). In this process, the output voltages of the respective cells P1 to P11 are supplied to the cell voltage input portion 22, and are supplied to the A/D converter 26 via the multiplexer 25, such that digitalized voltage data is input to the control portion 27. In addition, the total voltage of the cell voltages of the respective cells P1 to P11 is calculated by the CPU 29 and this total voltage is stored in the memory 28. In addition, when a voltage measurement request signal is transmitted from the main microcomputer 33, the voltage data that is stored in the memory 28 is transmitted to the main microcomputer 33.

The main microcomputer 33 acquires the voltage data that is transmitted from the first voltage detecting IC (21-1), and determines whether or not the total cell voltage that is detected by the first voltage detecting IC (21-1) is equal to or greater than the threshold voltage that is set in advance (step S14). In addition, when it is determined that the total cell voltage is equal to or greater than the threshold voltage (YES in step S14), the main microcomputer 33 determines that the power for operating the first voltage detecting IC (21-1) may be supplied by the cell voltages that are output from the respective cells P1 to P11, and outputs a power source switching request signal to the first voltage detecting IC (21-1) (step S15).

The control portion 27 of the first voltage detecting IC (21-1) receives this power source switching request signal, and performs control of switching the selection switch SW1 to the cell side. As a result, the first voltage detecting IC (21-1) operates using the cell voltages that are output from the respective cells P1 to P11 of the first block 61-1 as the power source voltage.

Subsequently, the main microcomputer 33 transmits a detection initiation signal of the cell voltage with respect to other voltage detecting ICs (21-2) to (21-5) (step S16). When receiving the detection initiation signal, the respective voltage detecting ICs (21-2) to (21-5) initiate the detection of the cell voltage. That is, each of the voltage detecting ICs (21-2) to (21-5) measures the total cell voltage for each of the blocks 61-2 to 61-5, and transmits the measured value to the main microcomputer 33.

Then, the main microcomputer 33 monitors the cell voltages that are transmitted from the respective voltage detecting ICs (21-1) to (21-5) to monitor whether or not the cell voltages of the respective blocks are normal voltages (step S17). Then, when the ignition is turned off (YES in step S18), the process is terminated.

On the other hand, when it is determined that in the process in step S14, the cell voltage is not equal to or greater than the threshold voltage (NO in step S14), the main microcomputer 33 determines whether or not a predetermined time has elapsed (step S19). When it is determined that the predetermined time has not elapsed (NO in step S19), the voltage is allowed to be continuously supplied by the DC/DC converter 42, and the detection of the cell voltage by the first voltage detecting IC (21-1) is continuously performed. Therefore, in a case where a voltage that is equal to or greater than a constant level is not output from each of the cells P1 to P55 for reasons such as fuel not being supplied to each of the cells P1 to P55, power is supplied from the DC/DC converter 42 to the power source circuit 23, and the detection of the cell voltage by the first voltage detecting IC (21-1) is continuously performed.

In addition, in a case where a state in which the cell voltage is not equal to or greater than the threshold voltage lasts for a constant time or more (YES in step S19), it is determined that an arbitrary abnormality has occurred in the fuel battery 13, and the main microcomputer 33 outputs an alarm signal (step S20). This alarm signal is transmitted to the host system of the voltage detection device 10 to inform passengers in the vehicle of the occurrence of the abnormality.

In this manner, in the voltage detection device 10 of the fuel cell according to the first embodiment of the invention, the plurality of cells P1 to P55 are classified into five blocks 61-1 to 61-5, and each of the voltage detecting ICs (21-1) to (21-5) is provided to each of the blocks 61-1 to 61-5. When the cell voltage of each of the blocks 61-1 to 61-5 is detected, at the time of initiating detection, the voltage that is raised by the DC/DC converter 42 is supplied with respect to the power source circuit 23 of the first voltage detecting IC (21-1), and the detection of the cell voltage is performed. In a case where the detected cell voltage has reached the threshold voltage, a supply source of power to the power source circuit 23 is switched to the cell side. Therefore, even when fuel is not supplied to the cell at an initial time and thus power is not sufficiently supplied from the cell side, the first voltage detecting IC (21-1) operates with power supplied from the DC/DC converter 42, and thus the cell voltage may be detected with high accuracy.

In addition, in a case where it is determined that in the first voltage detecting IC (21-1), the cell voltage has reached the threshold value, the measurement of the cell voltage by other voltage detecting ICs (21-2) to (21-5) is initiated. That is, in a case where it is determined that in the first voltage detecting IC (21-1), the cell voltage of the first block 61-1 has reached the threshold voltage, it may be determined that fuel is being supplied to each of the cells P1 to P55 and it may be determined that a sufficient cell voltage is also being supplied to the second to fifth voltage detecting ICs (21-2) to (21-5), such that the measurement of the cell voltage by the second to fifth voltage detecting ICs (21-2) to (21-5) is initiated. Therefore, in the respective voltage detecting ICs (21-2) to (21-5), the detection of the cell voltage may be also performed with high accuracy.

Furthermore, in this embodiment, since it is configured that the DC/DC converter 42 is used and this DC/DC converter 42 is connected to the first voltage detecting IC (21-1), voltage detection by the respective voltage detecting ICs (21-1) to (21-5) may be reliably performed without using a large number of DC/DC converters.

In addition, in the above-described first embodiment, a description was made with respect to an example in which when the cell voltage detected by the first voltage detecting IC (21-1) has reached the threshold voltage, the selection switch SW1 is switched and thus the supply source of the power is changed from the DC/DC converter 42 to the cell side. However, even after the cell voltage has reached the threshold voltage, the power may be supplied from the DC/DC converter 42 to only the first voltage detecting IC (21-1) so as to operate it. In this case, since only the first voltage detecting IC (21-1) operates with the power supplied from the battery 41, the power may be continuously supplied without imposing too much of a burden on the battery 41.

Figure 5:
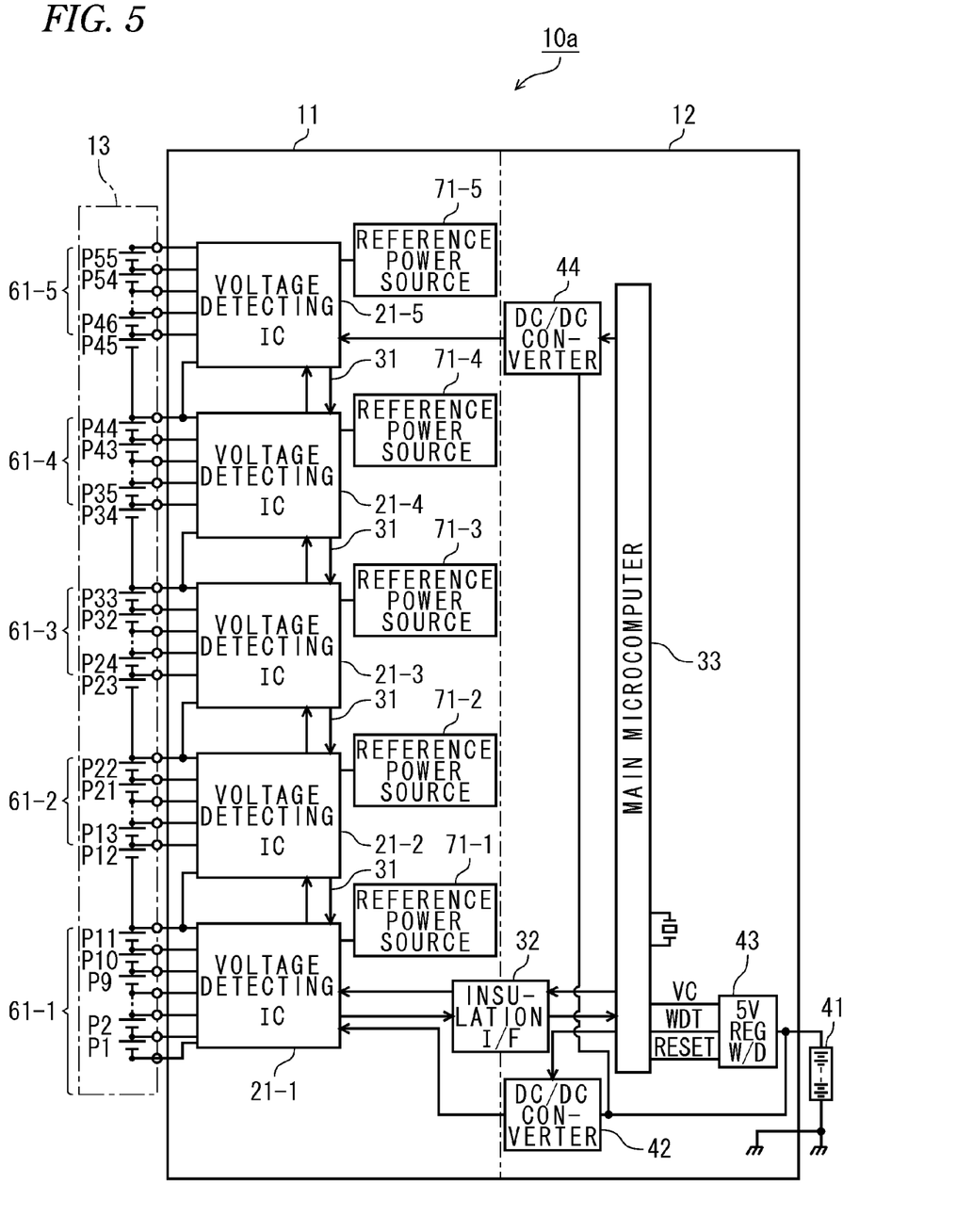
FIG. 5 is a block diagram illustrating a configuration of the voltage detection device of the fuel cell according to the second embodiment of the invention.

Next, a voltage detection device according to a second embodiment of the invention will be described. FIG. 5 shows a block diagram illustrating a fuel battery 13 including a voltage detection device 10a of the fuel cell according to the second embodiment of the invention, and the plurality of cells P1 to P55. As is the case with the above-described first embodiment, the fuel battery 13 according to the second embodiment may be used for supplying power to operate a vehicle driving motor in a state of being mounted in the vehicle.

The second embodiment and the above-described first embodiment are different in that in the second embodiment, a second DC/DC converter 44 is provided, and an output voltage of the DC/DC converter 44 is supplied to the fifth voltage detecting IC (21-5). Other configurations are the same as the first embodiment. That is, in the second embodiment, the fifth voltage detecting IC (21-5) has the same configuration as the first voltage detecting IC (21-1) shown in FIG. 2, and the second to fourth voltage detecting IC (21-2) to (21-4) have a configuration shown in FIG. 3.

Figure 6:
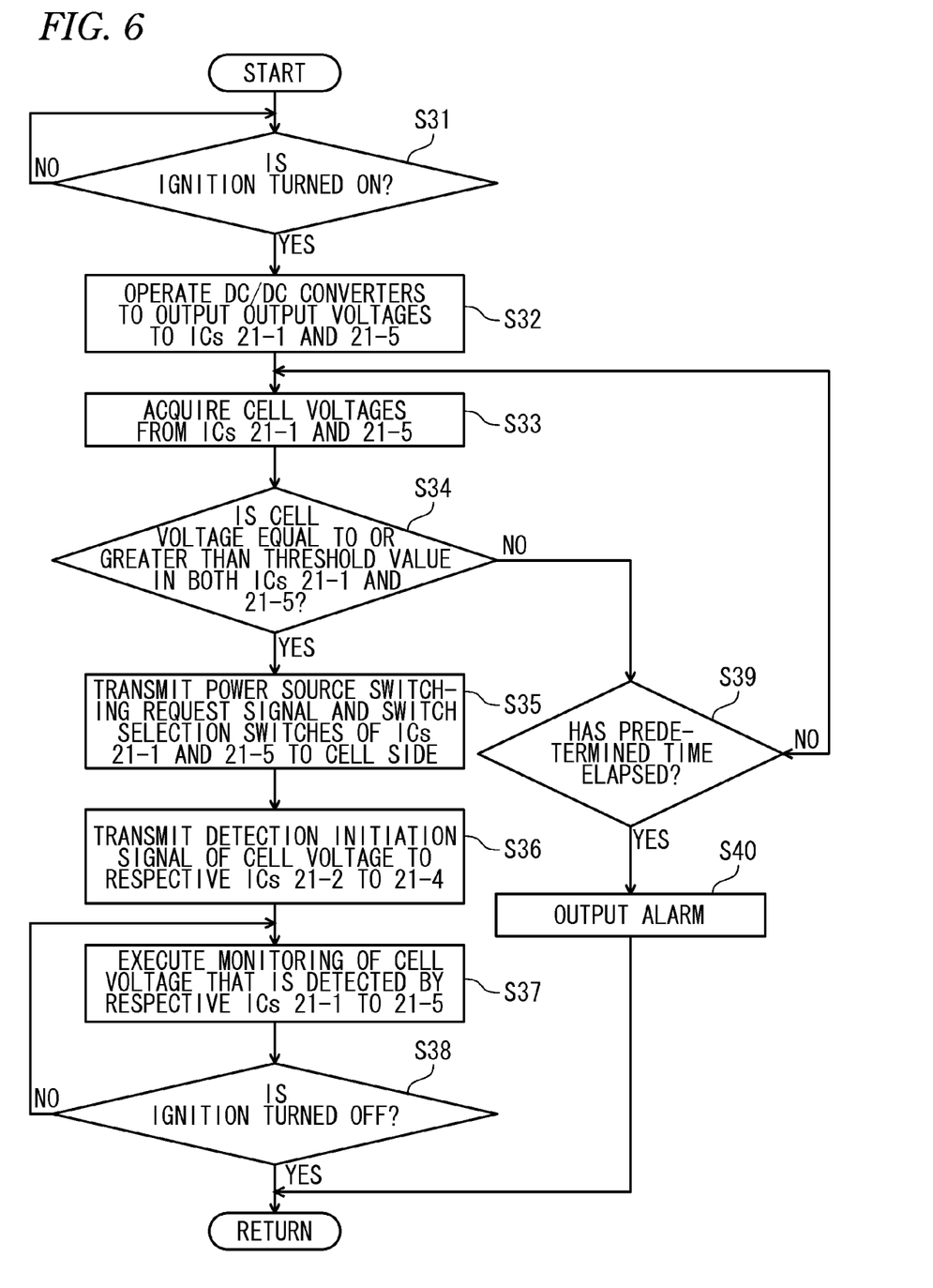
FIG. 6 is a flowchart illustrating a processing operation of the voltage detection device of the fuel cell according to the second embodiment of the invention.

Hereinafter, an operation of the voltage detection device 10a according to the second embodiment will be described. FIG. 6 shows a flowchart illustrating a process sequence by the main microcomputer 33 according to the second embodiment.

First, the main microcomputer 33 determines whether or not an ignition of the vehicle is turned on from a host system (step S31). In addition, when it is determined that the ignition is turned on (YES in step S31), the main microcomputer 33 operates the two DC/DC converters 42 and 44 to output an output voltage of the respective DC/DC converters 42 and 44 to the first voltage detecting IC (21-1) and the fifth voltage detecting IC (21-5) (step S32). As a result, the output voltage (for example, 12 V) of the battery 41 is raised to a high voltage of substantially 40 V, and is supplied to the first voltage detecting IC (21-1) and the fifth voltage detecting IC (21-5).

In addition, the main microcomputer 33 transmits a selection instruction signal of the output voltage of the respective DC/DC converters 42 and 44 to the first voltage detecting IC (21-1) and the fifth voltage detecting IC (21-5). As a result, in regard to the first voltage detecting IC (21-1), the selection switch SW1 shown in FIG. 2 is connected to the DC/DC converter 42 side, and the power source circuit 23 acquires output voltage from the DC/DC converter 42, and generates a power source voltage for operating the first voltage detecting IC (21-1). Similarly, in regard to the fifth voltage detecting IC (21-5), the selection switch SW1 is connected to the DC/DC converter 44 side, and the power source circuit 23 acquires output voltage from the DC/DC converter 44, and generates a power source voltage for operating the fifth voltage detecting IC (21-5).

Then, the first and fifth voltage detecting ICs (21-1) and (21-5) initiate detection of the output voltages of the respective cells P1 to P11 and P45 to P55 (step S33). In this process, the output voltages of the respective cells P1 to P11 (and P45 to P55) are supplied to the cell voltage input portion 22, and are supplied to the A/D converter 26 via the multiplexer 25, such that digitalized voltage data is input to the control portion 27. In addition, the total voltage of the cell voltages of the respective cells P1 to P11 (and P45 to P55) is calculated by the CPU 29 and this total voltage is stored in the memory 28. In addition, when a voltage measurement request signal is transmitted from the main microcomputer 33, the voltage data that is stored in the memory 28 is transmitted to the main microcomputer 33.

The main microcomputer 33 acquires the voltage data that is transmitted from the first voltage detecting IC (21-1) and the fifth voltage detecting IC (21-5), and determines whether or not both of the total cell voltage that is detected by the first voltage detecting IC (21-1) and the total cell voltage that is detected by the fifth voltage detecting IC (21-5) are equal to or greater than the threshold voltage that is set in advance (step S34). In addition, when it is determined that both of the total cell voltages are equal to or greater than the threshold voltage (YES in step S34), the main microcomputer 33 determines that the power for operating the first voltage detecting IC (21-1) may be supplied by the cell voltages that are output from the respective cells P1 to P11, and the power for operating the fifth voltage detecting IC (21-5) may be supplied by the cell voltages that are output from the respective cells P45 to P55, and outputs a power source switching request signal to the first voltage detecting IC (21-1) and the fifth voltage detecting IC (21-5) (step S35).

The control portion 27 of the first voltage detecting IC (21-1) receives this power source switching request signal, and performs control of switching the selection switch SW1 to the cell side. As a result, the first voltage detecting IC (21-1) operates using the cell voltages that are output from the respective cells P1 to P11 as the power source voltage. Similarly, the control portion 27 of the fifth voltage detecting IC (21-5) performs control of switching the selection switch SW1 to the cell side. As a result, the fifth voltage detecting IC (21-5) operates using the cell voltages that are output from the respective cells P45 to P55 as the power source voltage.

Subsequently, the main microcomputer 33 transmits a detection initiation signal of the cell voltage with respect to the second to fourth voltage detecting ICs (21-2) to (21-4) that are other voltage detecting ICs (step S36). When receiving the detection initiation signal, the second to fourth voltage detecting ICs (21-2) to (21-4) initiate the detection of the cell voltage. That is, each of the voltage detecting ICs (21-2) to (21-5) measures the total cell voltage for each of the blocks, and transmits the measured value to the main microcomputer 33.

Then, the main microcomputer 33 monitors the cell voltages that are transmitted from the respective voltage detecting ICs (21-1) to (21-5) to monitor whether or not the cell voltages of the respective blocks 61-1 to 61-5 are normal voltages (step S37). Then, when the ignition is turned off (YES in step S38), the process is terminated.

On the other hand, when it is determined that in the process in step S34, the cell voltage is not equal to or greater than the threshold voltage (NO in step S34), the main microcomputer 33 determines whether or not a predetermined time has elapsed (step S39). When it is determined that the predetermined time has not elapsed (NO in step S39), the voltage is allowed to be continuously supplied by the respective DC/DC converters 42 and 44, and the detection of the cell voltage by the first voltage detecting IC (21-1) and the fifth voltage detecting IC (21-5) is continuously performed. Therefore, in a case where a voltage that is equal to or greater than a constant level is not output from each of the cells P1 to P55 for reasons such as fuel not being supplied to each of the cells P1 to P55, power is supplied from the DC/DC converters 42 and 44 to the power source circuit 23, and the detection of the cell voltage by the first voltage detecting IC (21-1) and the fifth voltage detecting IC (21-5) is continuously performed.

In addition, in a case where a state in which the cell voltages of both of the first voltage detecting IC (21-1) and the fifth voltage detecting IC (21-5) are not equal to or greater than the threshold voltage lasts for a constant time or more (YES in step S39), it is determined that arbitrary abnormality occurs in the fuel cell, and the main microcomputer 33 outputs an alarm signal (step S40). This alarm signal is transmitted to the host system of the voltage detection device 10a to inform passengers in the vehicle of the occurrence of abnormality.

In this manner, in the voltage detection device 10a of the fuel cell according to the second embodiment of the invention, the respective plurality of cells P1 to P55 are classified into five blocks 61-1 to 61-5, and each of the voltage detecting ICs (21-1) to (21-5) is provided to each of the blocks 61-1 to 61-5. When the cell voltage of each of the blocks 61-1 to 61-5 is detected, at the time of initiating detection, the voltages that are raised by the DC/DC converters 42 and 44 are supplied with respect to the power source circuits 23 of the first voltage detecting IC (21-1) and the fifth voltage detecting IC (21-5), respectively, and the detection of the cell voltage is performed. In a case where the detected cell voltage has reached the threshold voltage, a supply source of the power to the power source circuits 23 is switched to the cell side. Therefore, even when the cell voltage is lower than the threshold voltage for reasons such as a case in which fuel is not supplied to the cell at an initial time, the first voltage detecting IC (21-1) and the fifth voltage detecting IC (21-5) may detect the cell voltage with high accuracy.

In addition, in a case where it is determined that in both of the first voltage detecting IC (21-1) and the fifth voltage detecting IC (21-5), the cell voltage has reached the threshold value, the measurement of the cell voltage by other voltage detecting ICs (21-2) to (21-4) is initiated. That is, in a case where it is determined that the cell voltages that are detected in both of the first voltage detecting IC (21-1) that measures the cell voltage of the first block 61-1 that is closest to the ground level, and the fifth voltage detecting IC (21-5) that measures the cell voltage of the fifth block 61-5 that outputs the highest voltage has reached the threshold voltage, it may be determined that fuel is being supplied to each of the cells P1 to P55 and it may be determined that a sufficient cell voltage is also being supplied to the second to fourth voltage detecting ICs (21-2) to (21-4), such that the measurement of the cell voltage by the voltage detecting ICs (21-2) to (21-4) is initiated. Therefore, in the respective voltage detecting ICs (21-2) to (21-4), the detection of the cell voltage may be also performed with high accuracy.

Furthermore, in this embodiment, since it is configured that the two DC/DC converters 42 and 44 are used, but the DC/DC converter is not provided for each of the voltage detecting ICs, the voltage detection by the respective voltage detecting ICs (21-1) to (21-5) may be reliably performed without using a large number of DC/DC converters.

In addition, in the above-described second embodiment, a description was made with respect to an example in which when the cell voltages detected by the first voltage detecting IC (21-1) and the fifth voltage detecting IC (21-5) has reached the threshold voltage, the selection switch SW1 is switched and thus the supply source of the power is changed from the DC/DC converters 42 and 44 to the cell side. However, even after the cell voltage has reached the threshold voltage, the power may be supplied from the DC/DC converters 42 and 44 to only the first and fifth voltage detecting ICs (21-1) and (21-5) so as to operate these. In this case, since only the first voltage detecting IC (21-1) and the fifth voltage detecting IC (21-5) operate with the power supplied from the battery 41, the power may be continuously supplied without imposing many burdens to the battery 41.

Hereinbefore, a description was made with respect to the voltage detection device of the fuel cell of the invention on the basis of the embodiments shown in drawings, the present invention is not limited thereto, and configurations of the respective parts may be substituted with arbitrary configurations having the same functions.

For example, a description was made with respect to an example in which one DC/DC converter is provided in the above-described first embodiment, and an example in which two DC/DC converters are provided in the second embodiment, but the invention is not limited thereto, and when the number of voltage detecting ICs is set to "N", the voltage detection by "N−1" voltage detecting ICs may be possible by providing "N−1" DC/DC converters. In addition, since a DC/DC converter is not provided for all of the voltage detecting ICs, a circuit configuration may be simple, and the cell voltage may be detected with high accuracy.

In addition, in the above-described embodiments, a description was made with respect to a DC/DC converter as the converter that converts the voltage as an example, but the invention may use other voltage converting devices.

Although the invention is described in detail and with reference to specific embodiments, it should be understood by those skilled in the art that various modifications and changes may be made without departing from the sprit and scope of the invention.

The present patent application is based on Japanese Patent Application (Japanese Patent Application No. 2010-103799 filed on Apr. 28, 2010, the contents of which are incorporated herein by reference.

INDUSTRIAL APPLICABILITY

The invention is very useful to realize a case where cell voltage may be detected even when fuel is not supplied to a cell of a fuel cell.

REFERENCE SIGNS LIST

10, 10a: Voltage detection device
11: High-voltage side device
12: Low-voltage side device
13: Fuel cell
21-1 to 21-5: First to fifth voltage detecting IC (voltage detection section)
22: Cell voltage input portion
23: Power source circuit
25: Multiplexer
26: A/D converter
27: Control portion
28: Memory
29: CPU
31: Communication line
32: Insulation interface
33: Main microcomputer (control section)
41: Battery
42, 44: DC/DC converters
43: Regulator
61-1 to 61-5: First to fifth blocks
71: Reference power source
SW1: Selection switch
P1 to P55: Cells

The invention claimed is:

1. A voltage detection device for detecting an output voltage of a fuel cell in which a plurality of cells are connected in series to output a desired voltage, wherein the plurality of cells are classified into N blocks, each block including at least one cell, wherein N≥2, the voltage detection device comprising:

voltage detection sections that are provided for the blocks respectively and measure cell voltages in the blocks;

a control section that is connected to the voltage detection sections through a communication line, outputs a voltage detection instruction to the respective voltage detection sections, and receives a voltage detection signal transmitted from each of the voltage detection sections; and one converter that raises the voltage, which is supplied from a DC power source, to a voltage of a driving power source for the voltage detection section, wherein the one converter is connected to a corresponding one block among the N blocks;

wherein the control section supplies power from the one converter to the corresponding voltage detection section of the corresponding one block to operate the corresponding voltage detection section when the output of the fuel cell is initiated, and in a case where a voltage that is detected by the corresponding voltage detection section which operates by the power supplied from the one converter, exceeds a predetermined threshold value, the control section controls the corresponding voltage detection section to change a driving power source for the corresponding voltage detection section from the power supplied from the one converter to the cell voltage of the corresponding one block and other voltage detection section corresponding to other block among the N blocks measures a cell voltage of the other block using the cell voltage of the other block as a driving power source of the other voltage detection section.

2. The voltage detection device according to claim 1, wherein the fuel cell is used as a driving power source of a motor which is mounted in a vehicle, and the DC power source is a battery which is mounted in the vehicle.

* * * * *